(12) United States Patent
Wu et al.

(10) Patent No.: US 12,254,950 B2
(45) Date of Patent: Mar. 18, 2025

(54) DIES, SEMICONDUCTOR PACKAGE STRUCTURES, ENABLE PIN CONFIGURATION METHODS AND MEMORIES

(71) Applicant: Yangtze Memory Technologies Co., Ltd., Hubei (CN)

(72) Inventors: Yingjun Wu, Hubei (CN); Huabin Yan, Hubei (CN); Dong He, Hubei (CN); Lei You, Hubei (CN)

(73) Assignee: YANGTZE MEMORY TECHNOLOGIES CO., LTD., Hubei (CN)

( * ) Notice: Subject to any disclaimer, the term of this patent is extended or adjusted under 35 U.S.C. 154(b) by 106 days.

(21) Appl. No.: 18/148,875

(22) Filed: Dec. 30, 2022

(65) Prior Publication Data
US 2024/0194227 A1 Jun. 13, 2024

Related U.S. Application Data

(63) Continuation of application No. PCT/CN2022/137657, filed on Dec. 8, 2022.

(51) Int. Cl.
*G11C 7/00* (2006.01)
*G11C 7/10* (2006.01)

(52) U.S. Cl.
CPC .......... *G11C 7/1039* (2013.01); *G11C 7/1063* (2013.01); *G11C 7/109* (2013.01)

(58) Field of Classification Search
CPC .......... G11C 16/0483; G11C 2207/105; G11C 2207/108; G11C 29/14; G11C 5/025;
(Continued)

(56) References Cited

U.S. PATENT DOCUMENTS

2014/0351525 A1   11/2014   Chen et al.
2022/0206719 A1    6/2022   Juan et al.
2023/0350606 A1*  11/2023   Hsu .................. G06F 3/0659

FOREIGN PATENT DOCUMENTS

CN    101958152 A    1/2011
CN    102543189 A    7/2012
(Continued)

OTHER PUBLICATIONS

International Searching Authority, "International Search Report," issued in connection with International Patent Application No. PCT/CN2022/137657, mailed on Aug. 9, 2023, 5 pages. [English Translation Included].

(Continued)

*Primary Examiner* — Thong Q Le
(74) *Attorney, Agent, or Firm* — HANLEY, FLIGHT & ZIMMERMAN, LLC

(57) ABSTRACT

In one example, a peripheral circuit in a die is configured to: first, receive control commands, and generate indication information according to the control commands, the control commands being used for indicating the die to determine the address of the die, the indication information being used for indicating M dies to share the same enable pin, M being a positive integer greater than or equal to 1; and then, determine the address of the die according to the indication information, and send the address of the die, the address being used for addressing an enable signal provided by the enable pin.

11 Claims, 7 Drawing Sheets

(58) Field of Classification Search
CPC ........... G11C 5/04; G11C 5/06; G11C 7/1039; G11C 7/1063; G11C 7/109; G11C 8/12; G11C 14/0018; G11C 7/1072; G11C 16/30; G11C 16/10; G11C 16/14; G11C 16/26; G11C 16/32; G11C 2216/20; G11C 7/22
See application file for complete search history.

(56) References Cited

FOREIGN PATENT DOCUMENTS

| | | |
|---|---|---|
| CN | 103246625 A | 8/2013 |
| CN | 108710579 A | 10/2018 |
| CN | 113468082 A | 10/2021 |
| CN | 114691554 A | 7/2022 |

OTHER PUBLICATIONS

International Searching Authority, "Written Opinion," issued in connection with International Patent Application No. PCT/CN2022/137657, mailed on Aug. 9, 2023, 6 pages. [English Machine Translation Included].

* cited by examiner

A peripheral circuit 610 receives control commands, and generates indication information according to the control commands, wherein the control commands are used for indicating a die 600 to determine the address of the die 600, the indication information is used for indicating M dies to share the same enable pin, and M is a positive integer greater than or equal to 1 ~ S1101 the peripheral circuit 610 determines the address of the die 600 according to the indication information, and sends the address of the die 600, and the address is used for addressing an enable signal provided by the enable pin ~ S1102

Fig. 11

A peripheral circuit 610 receives control commands, and generates indication information according to the control commands, wherein the control commands are used for indicating a die 600 to determine the address of the die 600, the indication information is used for indicating M dies to share the same enable pin, and M is a positive integer greater than or equal to 1 ~ S1101

The peripheral circuit 610 determines the address of the die 600 according to the indication information, and sends the address of the die 600, and the address is used for addressing an enable signal provided by the enable pin ~ S1102

A first decoding circuit 6122 sets a first numerical value in a register 6124 to be a second numerical value, the first numerical value is used for indicating that a encoded value of the die 600 is a second encoded value, and the second numerical value is used for indicating that the encoded value of the die 600 is a first encoded value ~ S1103

Fig. 12

A peripheral circuit 610 receives control commands, and generates indication information according to the control commands, wherein the control commands are used for indicating a die 600 to determine the address of the die 600, the indication information is used for indicating M dies to share the same enable pin, and M is a positive integer greater than or equal to 1 —— S1301

The peripheral circuit 610 determines the address of the die 600 according to the indication information, and sends the address of the die 600, and the address is used for addressing an enable signal provided by the enable pin —— S1302

A first decoding circuit 6122 sets a first numerical value in a register 6124 to be a second numerical value, the first numerical value is used for indicating that a encoded value of the die 600 is a second encoded value, and the second numerical value is used for indicating that the encoded value of the die 600 is a first encoded value —— S1303

The peripheral circuit 610 in a target die receives chip selection signals, the chip selection signals are used for selecting the target die to receive the enable signal, and the chip selection signals include the address of the target die —— S1304

Fig. 13

DIES, SEMICONDUCTOR PACKAGE STRUCTURES, ENABLE PIN CONFIGURATION METHODS AND MEMORIES

CROSS-REFERENCE TO RELATED APPLICATIONS

This application is a continuation of and claims the benefit of International Application No. PCT/CN2022/137657, filed on Dec. 8, 2022, which is hereby incorporated by reference in its entirety.

TECHNICAL FIELD

Examples of the present disclosure relate to the technical field of storage, and in particular, to a die, a semiconductor package structure, an enable pin configuration method, and a memory.

BACKGROUND

A NAND storage device includes a main control chip, and a plurality of flash memory chips coupled with chip enable pins (CE pins) of the main control chip. With the increasing requirements of application programs for the capacity of the NAND storage device, in order to improve the capacity of the NAND storage device, a variety of package modes have emerged for package flash memory chips, and the plurality of package modes may reduce the number of chip enable pins of the flash memory chips, so that when the number of chip enable pins of the main control chip is fixed, the main control chip may be coupled with more flash memory chips to improve the capacity of the NAND storage device.

However, since the number of chip enable pins included in the flash memory chip packaged in any one of the plurality of package modes mentioned above is fixed, and thus cannot be adjusted according to the requirements of the capacity of the NAND storage device and the number of chip enable pins of the main control chip, in this way, flash memory chips in a plurality of package modes need to be produced and tested for customer selection, such that the production cost is relatively high, and the production efficiency is relatively low.

BRIEF DESCRIPTION OF THE DRAWINGS

To illustrate technical solutions in the present disclosure more clearly, a brief introduction on the drawings, which are needed in some examples of the present disclosure, will be given below. Apparently, the drawings in the description below are merely drawings of some examples of the present disclosure, and other drawings may be obtained based on the accompanying drawings by those ordinary skilled in the art. In addition, the drawings in the following description may be regarded as schematic diagrams, and are not intended to limit the actual sizes of products, the actual processes of methods, the actual timing of signals and the like involved in examples of the present disclosure.

FIG. 11 is a flow diagram of an enable pin configuration method of a die according to some examples;

FIG. 12 is a flow diagram of another enable pin configuration method of a die according to some examples; and FIG. 13 is a flow diagram of an enable pin configuration method of a semiconductor package structure according to some examples.

DETAILED DESCRIPTION

Figure 1:
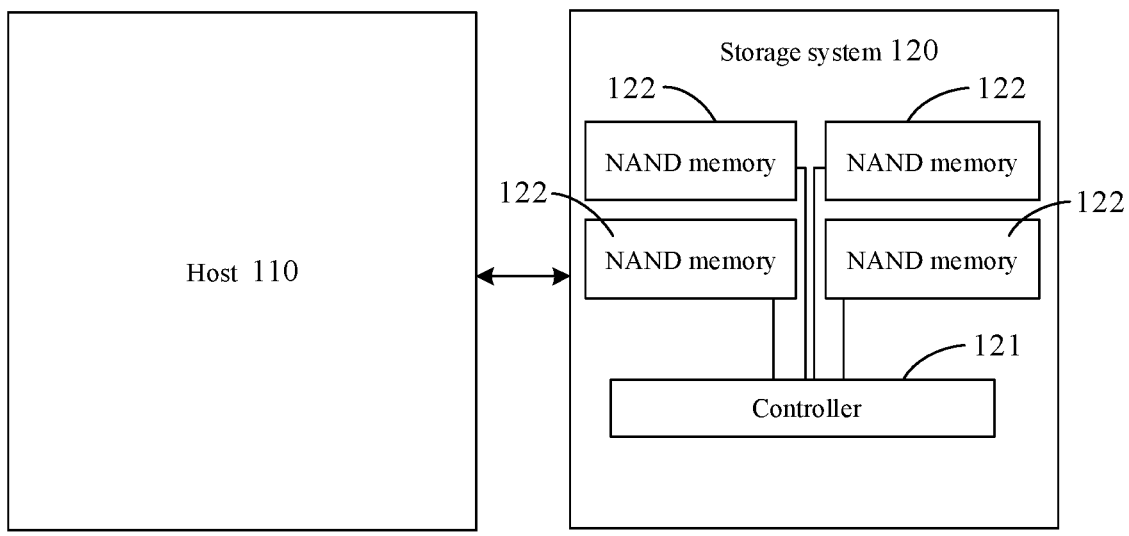
FIG. 1 is a schematic diagram of the structure of an electronic device according to some examples.

A clear and complete description of technical solutions in some examples of the present disclosure will be given below, in combination with the drawings. Apparently, the examples described below are merely a part, but not all, of examples of the present disclosure. All of other examples, obtained by those ordinary skilled in the art based on the examples provided in the present disclosure, fall into the protection scope of the present disclosure.

Unless the context requires otherwise, throughout the specification and claims, the term "include" is interpreted as an open and inclusive meaning, that is, "including, but not limited to". In the description of the specification, the terms "one example", "some examples" and the like are intended to indicate that particular features, structures, materials or characteristics related to the examples or examples are included in at least one example or example of the present disclosure. The schematic representation of the above terms does not necessarily refer to the same example or example. Furthermore, the particular features, structures, materials or characteristics may be included in any suitable mode in any one or more examples or examples.

The terms "first" and "second" are used only for descriptive purposes and cannot be understood as indicating or implying relative importance or implicitly indicating the number of indicated technical features. Thus, the features limited with "first" and "second" may explicitly or implicitly include one or more of the features. In the description of examples of the present disclosure, unless otherwise specified, "a plurality of" means two or more.

When some examples are described, "coupled" and "connected" and their derived expressions may be used. For example, the term "connected" may be used in the description of some examples to indicate that two or more components have a direct physical contact or electrical contact with each other. As another example, the term "coupled" may be used in the description of some examples to indicate that two or more components have a direct physical contact or electrical contact. However, the term "coupled" may also mean that two or more components are not in direct contact with each other, but still cooperate or interact with each other. The examples disclosed herein are not necessarily limited to the disclosure herein.

"At least one of A, B and C" has the same meaning as "at least one of A, B or C", and both includes the following combinations of A, B and C: only A, only B, only C, a combination of A and B, a combination of A and C, a combination of B and C, and a combination of A, B and C.

"A and/or B" includes the following three combinations: only A, only B, and a combination of A and B.

The use of "applicable to" or "configured to" herein means open and inclusive language, which does not exclude devices applicable to or configured to execute additional tasks or steps.

In addition, the use of "based on" means open and inclusive, because processes, steps, calculations or other actions "based on" one or more of the conditions or values may be based on additional conditions or exceed the values in practice.

Examples of the present disclosure provide an electronic device. For example, the electronic device may be any of a mobile phone, a desktop computer, a tablet computer, a notebook computer, a server, a vehicle-mounted device, a wearable device (such as a smart watch, a smart wristband, smart glasses and the like), a mobile power supply, a gaming machine, or a digital multimedia player, etc. For example, FIG. 1 shows a schematic diagram of the structure of an electronic device provided in examples of the present disclosure. The electronic device includes a host 110 and a storage system 120, and the host 110 is coupled with the storage system 120, so as to write data into the storage system 120 or read data stored in the host 110. The host 110 may also be referred to as a master device, the storage system 120 may also be referred to as a slave device, and in the electronic device, the slave device may be accessed by different master devices. For example, taking it as an example that the electronic device is a mobile phone, central processing unit (CPU), digital signal processor (DSP), and the like of the mobile phone may each serve as the host 110 to access the storage system 120.

Specifically, host 110 is used for executing data processing of a NAND memory 122. For example, host 110 may include a central processor or a system-on-chip (SoC), such as an application processor. The data is transmitted between host 110 and controller 121 by means of at least one of a variety of interface protocols.

For example, the interface protocols include at least one of universal serial bus (USB) protocol, Microsoft management console (MMC) protocol, peripheral component interconnect (PCI) protocol, PCI express (peripheral component interconnect express, PCI-E) protocol, advanced technology attachment (ATA) protocol, serial ATA protocol, parallel ATA protocol, small computer system interface (SCSI) protocol, integrated drive electronic (IDE) protocol or firewire protocol.

The storage system 120 includes a controller 121 and a plurality of memories. The plurality of memories may include a plurality of NAND memories (or may be referred to as NAND flash memory chips or flash memory chips) 122, and/or, include a plurality of dynamic random access memories (DRAMs), and examples of the present application are for example illustrated by taking it as an example that the storage system 120 includes a plurality of NAND memories 122. The controller 121 is used for balancing the write load of data on the NAND memories 122, and coordinating and maintaining the cooperation between different NAND memories 122, so as to reduce the average read/write erase loss of all NAND memories 122, reduce the occurrence of bad blocks, and prolong the service life of NAND memories 122.

Specifically, the controller 121 may process input/output (I/O) requests received from the host 110, and ensure the integrity and effective storage of the data to be stored according to the I/O requests. For example, the controller 121 may cache the data received from host 110, and perform redundant arrays of independent disks (RAID) (or referred to as disk arrays) calculation according to the received data, so as to obtain RAID check data and cache the RAID check data. The RAID check data is used for recovering data damaged in encoding or storage process. The controller 121 may also send the data received from host 110 and the calculated RAID check data to the NAND memories 122 for storage.

In some examples, the controller 121 may be configured to control operations in NAND memories 122, such as reading, writing, erasing, or encoding, etc. The controller 121 may also be configured to manage various functions of data stored or to be stored in NAND memories 122, including but not limited to, functions such as bad block management, garbage collection, logical address to physical address translation, or loss equalization, etc. In some implementations, the controller 121 is further configured to recover data read from NAND memories 122 or written into NAND memories 122 by using error correction code (ECC). Of course, the controller 121 may also execute any other suitable functions on NAND memories 122, for example, formatting NAND memories 122, which is not specifically limited in examples of the present application.

In some implementations, the controller 121 may control the operations of NAND memories 122 by means of a generated control signal, to control striping, computing or storage of the data of NAND memories 122. Alternatively, the controller 121 may receive a signal for the operations of NAND memories 122 from the host 110, to control the striping, computing or storage of the data of NAND memories 122.

In some implementations, the controller 121 may have different modules in a single apparatus. The single apparatus is, for example, an integrated circuit chip, such as an application specific integrated circuit (ASIC) or a field programmable gate array (FPGA), or a single apparatus having dedicated functions. In some implementations, the components of the controller 121 may be in an integrated device, or distributed at different positions but communicate with each other by network.

Figure 2:
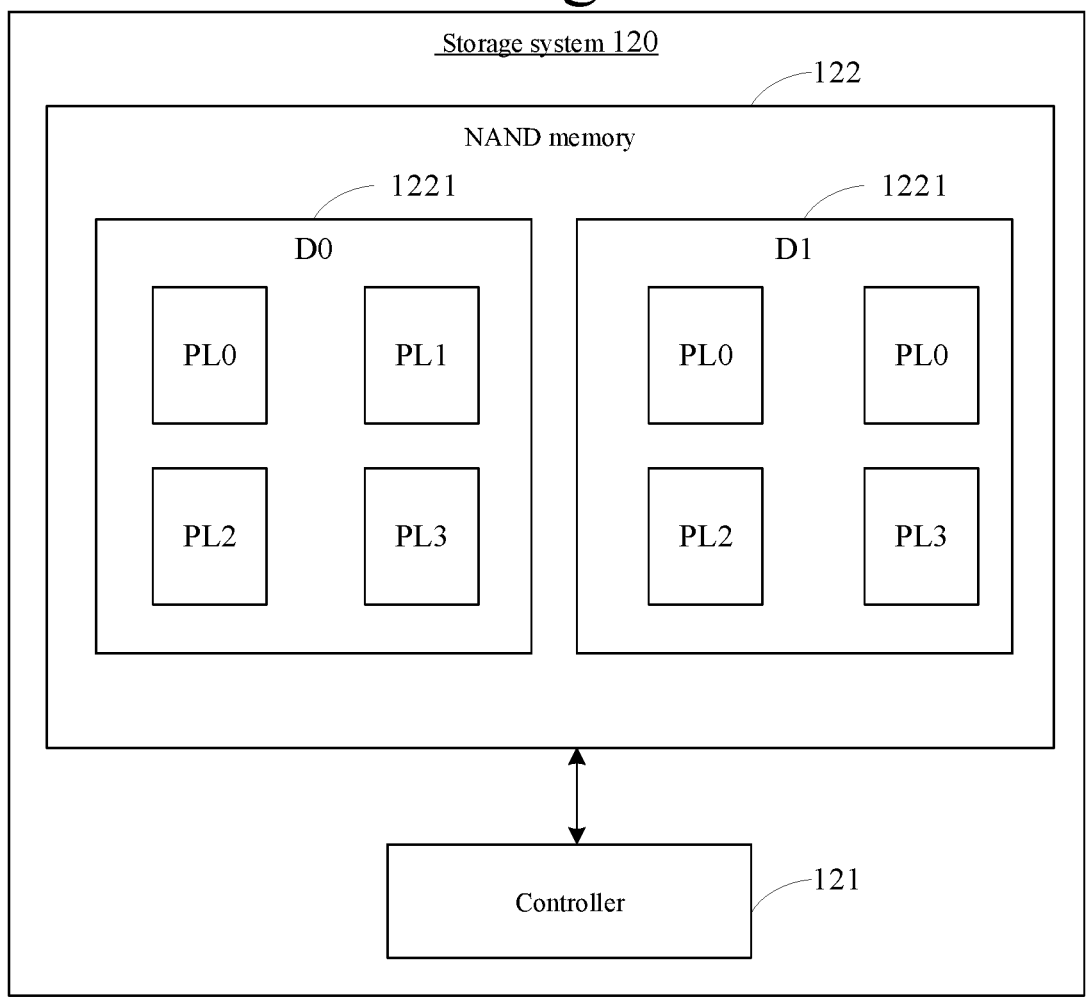
FIG. 2 is a schematic diagram of the structure of a NAND memory according to some examples.

FIG. 2 shows a schematic diagram of the structure of a NAND memory 122 provided in examples of the present disclosure. In order to increase the storage capacity, the NAND memory 122 typically includes a plurality of dies 1221, for example, D0 and D1. Each of dies 1221 has a plurality of planes (PLs), such as PL0, PL1, PL2 and PL3.

Each of PLs may include one or more memory blocks, and each memory block may be further divided into a plurality of strings (STRs). Each STR includes memory cells for storing upper page (UP) data portion, middle page (MP) data portion and lower page (LP) data portion. The memory cells are coupled to a plurality of word lines (WLs) that are arranged vertically, and are coupled to a plurality of bit lines (BL) that are arranged horizontally. On structure, each STR may include a plurality of gate conductive layers that extend laterally. One memory block includes a plurality of gate conductive layers that are stacked vertically, and each gate conductive layer is coupled to the memory cells distributed laterally in a plurality of pages in the STR in the memory block.

In one possible example, each memory cell in the NAND memory 122 above may be a charge trap-type transistor. The structure of the charge trap-type transistor is similar to that of a metal-oxide-semiconductor field-effect transistor (MOSFET), and the difference lies in that a charge trap layer is inserted into the gate oxide dielectric layer of the MOSFET in the charge trap-type transistor, and the charge trap layer is used for storing charges. In some examples, the memory cell mentioned above may also be a floating gate-type transistor. An additional floating gate (FG) (referred to as a floating gate for short) is inserted into the gate oxide dielectric layer of the MOSFET in the floating gate-type transistor. The floating gate is used for storing charges, and the floating gate-type transistor has two gates (conventional control gate (GC) and floating gate). The floating gate-type transistor differs from the charge trap-type transistor in that charge storage materials are different, for example, the floating gate-type transistor stores charges by using the floating gate, and the floating gate is a conductor, so the charges may move freely in the floating gate; and the charge trap-type transistor stores charges by using the charge trap layer, and the charge trap layer is an insulator, for example, the charge trap layer may be made of silicon nitride, so the charges are not suitable for moving in the charge trap layer.

Figure 3:
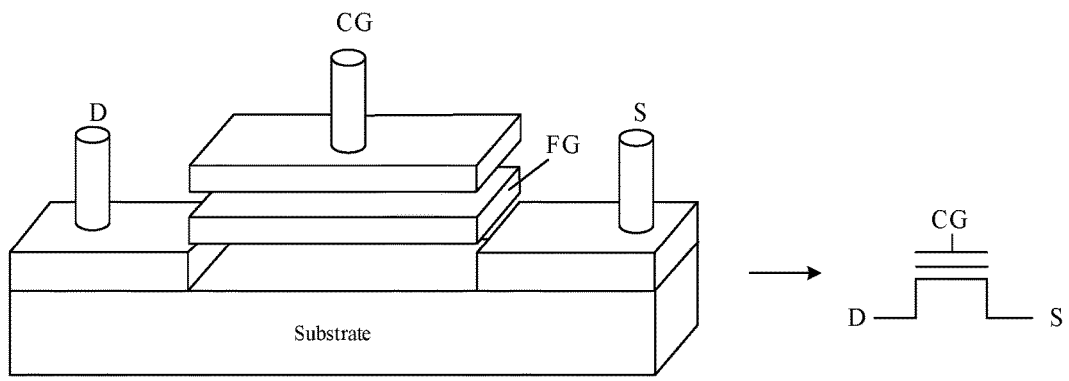
FIG. 3 is a schematic diagram of the structure of a memory cell according to some examples.

FIG. 3 shows a schematic diagram of the structure of a memory cell in the NAND memory 122. The memory cell of the NAND memory includes a source (S), a drain (D) and a gate (G), and further includes a floating gate and a control gate. When the threshold voltage of the memory cell is greater than a threshold value (also referred to as reference threshold voltage), it is identified as data "0", and when the threshold voltage of the memory cell is less than the threshold value, it is identified as data "1", wherein an insulating layer is between the floating gate and a substrate, and in the case of power down, the insulating layer isolates the floating gate from the outside, so that the floating gate does not lose charges, thereby preventing data loss in the case of power down.

In an initial state, no charge is stored in the floating gate, so the initial value of stored data of the memory cell is "1". According to the F-N (fowler-nordheim) tunneling effect, the data stored in the memory cell may be changed by changing the amount of charges stored in the floating gate. For example, by applying a program voltage to the control gate, the charges pass through the insulating layer to charge the floating gate, that is, enabling writing data, and this process is called program operation. Correspondingly, the data stored in the memory cell changes from "1" to "0". The charges in the floating gate discharges by means of the insulating layer, that is, enabling erasing data, and this process is called erase (erase) operation. Correspondingly, the data stored in the memory cell changes from "0" to "1".

Since the NAND memory 122 has relatively large capacity and high rewrite speed, the NAND memory 122 is widely applied in various electronic devices or storage devices.

Figure 4:
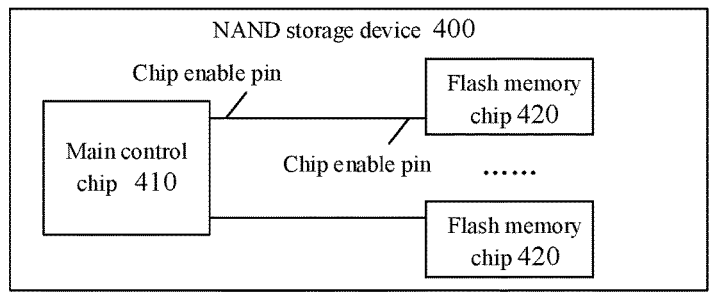
FIG. 4 is a schematic diagram of the structure of a NAND storage device according to some examples.

For example, FIG. 4 shows a schematic diagram of the structure of a NAND storage device 400 provided in examples of the present disclosure. The NAND storage device 400 is a specific storage system 120. The NAND storage device 400 includes a main control chip 410 (equivalent to the controller 121 described above) and a plurality of flash memory chips 420 (equivalent to the NAND memory 122 described above). A plurality of chip enable pins on the main control chip 410 are coupled with chip enable pins on the plurality of flash memory chips 420, respectively. The plurality of flash memory chips 420 are used for storing data, and the main control chip 410 is used for balancing the write load of the data on the flash memory chips 420, and coordinating and maintaining the cooperation between different flash memory chips 420, so as to reduce the read/write erase loss of all flash memory chips 420, reduce the occurrence of bad blocks, and prolong the service life of the flash memory chips 420.

With the continuous increasing requirements of an application program for the capacity of the NAND storage device 400, in order to improve the capacity of the NAND storage device 400, a plurality of package modes have been developed for packaging the flash memory chip 420, and the plurality of package modes may reduce the number of chip enable pins of the flash memory chip 420, so that when the number of chip enable pins of the main control chip 410 is fixed, the main control chip 410 may be coupled with more flash memory chips 420 to improve the capacity of the NAND storage device 400.

Specifically, it is taken as an example that the flash memory chip 420 is a ball grid array (BGA) 132 with an octal die package (ODP). As shown in (a) in FIG. 5, the flash memory chip 420 may be packaged in such a way that one chip enable pin is coupled with one die. The address of each die may be lun0. The flash memory chip 420 is coupled with the main control chip 410 by means of eight chip enable pins, and the main control chip 410 may enable corresponding dies by means of different chip enable pins. Or, as shown in (b) in FIG. 5, the flash memory chip 420 may be packaged in such a way that one chip enable pin is coupled with two dies. The addresses of every two dies may be lun0 and lun1 respectively for distinguishing. The flash memory chip 420 is coupled with the main control chip 410 by means of four chip enable pins, and the main control chip 410 may enable corresponding dies by means of different chip enable pins and the addresses of the dies. Or, as shown in (c) in FIG. 5, the flash memory chip 420 may be packaged in such a way that one chip enable pin is coupled with four dies. The addresses of every four dies may be lun0, lun1, lun2 and lun3 respectively for distinguishing. The flash memory chip 420 is coupled with the main control chip 410 by means of two chip enable pins, and the main control chip 410 may enable corresponding dies by means of different chip enable pins and the addresses of the dies.

Figure 5:
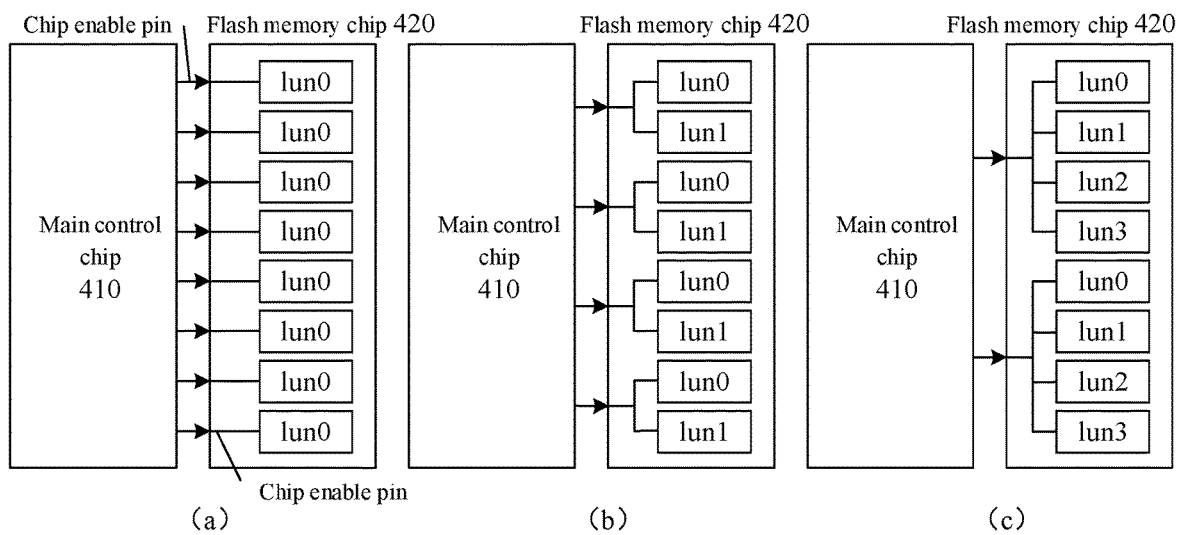
FIG. 5 is a schematic diagram of the structure of a flash memory chip according to some examples.

It can be understood that, compared with the flash memory chip 420 shown in (a) in FIG. 5, the flash memory chip 420 shown in (b) and (c) in FIG. 5 includes the same number of dies, but includes fewer chip enable pins. When the number of chip enable pins of the main control chip 410 is fixed, the flash memory chip 420 shown in (b) and (c) in FIG. 5 may be used, so that the main control chip 410 can be coupled with more flash memory chips 420, to improve the capacity of the NAND storage device 400 and to meet the requirements of application programs.

However, since the number of chip enable pins included in the flash memory chip 420 in the plurality of package modes shown in FIG. 5 is fixed, a customer cannot adjust the number of chip enable pins on the flash memory chip 420 according to the requirements of application programs for the capacity of the NAND storage device 400 and the number of chip enable pins of the main control chip 410. Therefore, flash memory chips 420 in a plurality of package modes need to be produced at the same time and are tested for selection of the customer.

Generally, the authentication of flash memory chips 420 in one package mode requires 2-3 months, so the flash memory chips 420 in the plurality of package modes need to occupy a large number of package reliability authentication resources and test program development resources, and the costs of future maintenance need to be increased, which causes higher production cost. Meanwhile, since the resources mentioned above are limited, there may be a sequential order in the authentication time of the flash memory chips 420 in different package modes, and the flash memory chips 420 waiting for authentication cannot be produced, resulting in lower production efficiency. Moreover, the requirements of different customers for the package modes of the flash memory chips 420 are also different, and if the flash memory chips 420 in one package mode are selected to be tested preferentially, the requirements of all customers cannot be met, resulting in lower satisfaction of customers. In addition, the flash memory chips 420 in different package modes are different types of products for the customers, and new material codes need to be added to distinguish different types of flash memory chips 420 during the use of customers, thereby increasing the material management and control costs of customers. For the flash memory chips 420 in each package mode, customers need to perform import authentication tests, so that the production efficiency of customers is relatively low, and the test costs of customers are increased.

In order to solve the problems of high production cost and low production efficiency resulting from the flash memory chip 420 including a fixed number of chip enable pins in various types of package modes, examples of the present disclosure provide a die, which may be applied in the flash memory chip 420, so that the production cost of the flash memory chip 420 can be reduced, and the production efficiency can be improved.

Figure 6:
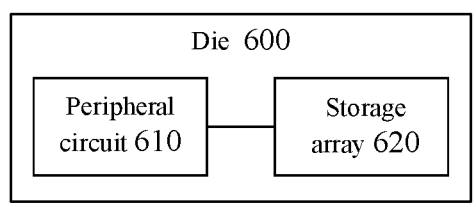
FIG. 6 is a schematic diagram of the structure of a die according to some examples.

FIG. 6 shows a schematic diagram of the structure of a die 600 provided in examples of the present disclosure. The die 600 may be applied to the NAND storage device 400 described above. The die 600 includes a peripheral circuit 610 and a storage array 620 coupled with the peripheral circuit 610.

The peripheral circuit 610 is configured to receive control commands, and generate indication information according to the control commands. The control commands are used for indicating the die 600 to determine the address of the die 600. The indication information is used for indicating M dies to share the same enable pin (also referred to as chip enable pin). M is a positive integer greater than or equal to 1.

Optionally, the die 600 may be any of the M dies, which is not limited in examples of the present disclosure.

Optionally, when the die 600 is applied to the flash memory chip 420 described above, the control commands may be generated by the main control chip 410. The peripheral circuit 610 may receive the control commands and generate the indication information according to the control commands.

Optionally, when the die 600 is applied to the flash memory chip 420, the M dies sharing the same enable pin includes: the M dies are coupled with the same enable pin of the main control chip 410, so as to share the same enable pin on the main control chip 410.

Optionally, values of M include 1, 2, 4, 8, 16 or 32, and the specific value of M is not limited in examples of the present disclosure.

For example, when the value of M is 1, the indication information mentioned above is used for indicating one die to use one enable pin of the main control chip 410. When the value of M is 2, the indication information mentioned above is used for indicating two dies to share the same enable pin of the main control chip 410.

In addition, the peripheral circuit 610 is further configured to determine the address of the die 600 according to the indication information, and send the address of the die 600 to the main control chip 410, and the address is used for addressing an enable signal provided by the enable pin, so that the main control chip 410 may enable the die 600 by means of the address of the die 600.

Specifically, when the value of M is equal to 1, it can be understood that, the indication information is used for indicating that one die is coupled with one enable pin, the one die is the die 600, and at this time, the peripheral circuit 610 may determine the address of the die 600 according to the indication information. For example, the peripheral circuit 610 may determine that the address of the die 600 is lun1 according to the indication information.

When the value of M is greater than 1, it can be understood that, the indication information is used for indicating that the M dies are coupled with one enable pin, the M dies include the die 600 therein, and at this time, the peripheral circuit 610 may include a plurality of implementations in the process of determining the address of the die 600 according to the indication information, and how the peripheral circuit 610 determines the address of the die 600 according to the indication information is not limited in examples of the present disclosure.

For example, when the value of M is greater than 1, the control commands received by the peripheral circuit 610 may further include address encoding information of the die 600, so that the indication information generated by the peripheral circuit 610 further includes the address encoding information of the die 600, and the peripheral circuit 610 may determine the address of the die 600 according to the address encoding information, so that duplication of the address of the die 600 with the addresses of other dies in the M dies can be avoided.

For example, when the value of M is 2, the control commands received by the peripheral circuit 610 may further include address encoding information 1 of the die 600, so that the indication information generated by the peripheral circuit 610 according to the control commands further includes the address encoding information 1 of the die 600, and the peripheral circuit 610 may determine that the address of the die 600 is lun1 according to the address encoding information in the indication information.

Optionally, the address encoded value of the die 600 may include one bit, or, may include more than one bit. How many bits are used for encoding the address of the die 600 is not limited in examples of the present application.

For example, the address of die 600 may be encoded as 1.

It can be understood that, when the die 600 provided in examples of the present disclosure is applied to the flash memory chip 420, first, enable pins coupled with the M dies 600 on the flash memory chip 420 may be connected together in a short-circuit mode by wiring in a printed circuit board (PCB), and then are coupled with one enable pin on the main control chip 410, so as to implement a configuration in which the M dies share the same enable pin physically. Then, the peripheral circuit 610 in the die 600 may receive the control commands, generate the indication information, and determine the address of the die 600 according to the indication information, to implement the configuration between the M dies and one enable pin logically, so that the flash memory chip 420 can be configured in different package forms.

According to the die 600 provided in examples of the present disclosure, the peripheral circuit 610 receives the control commands, generates the indication information, and determines the address of the die 600 according to the indication information, so that the configuration in which M dies share one enable pin can be implemented logically. In such way, when the die 60) is applied to the flash memory chip 420, the number of enable pins of the flash memory chip 420 can be flexibly configured according to the requirements of application programs for the capacity of the NAND storage device 400 and the number of enable pins of the main control chip 410, so that package modes of the flash memory chip 420 can be reduced during production, thereby reducing occupied package reliability authentication resources and test program development resources, reducing production cost, and improving production efficiency. For example, since package modes of the flash memory chip is few, it is beneficial for customers to reducing import authentication tests, reducing material management and control costs, and meanwhile, it is also beneficial for customers to reducing test costs and improving production efficiency. In addition, during the use of customers, by configuring the number of enable pins of the flash memory chip 420, different production requirements can be met, and the satisfaction of customers can be improved.

Figure 7:
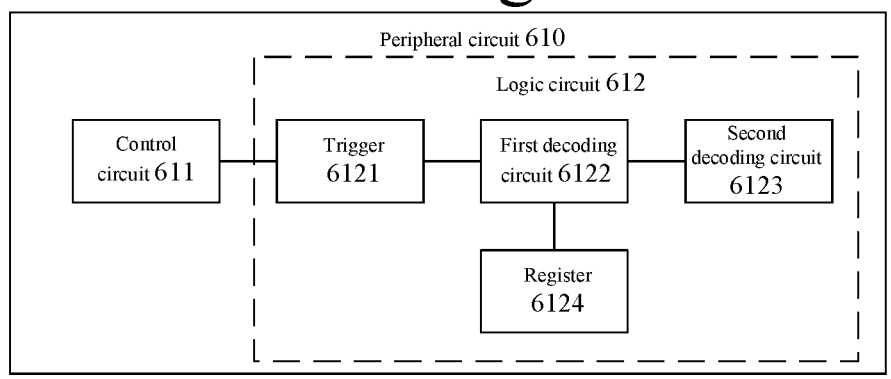
FIG. 7 is a schematic diagram of the structure of a peripheral circuit according to some examples.

In one possible example, as shown in FIG. 7, the peripheral circuit 610 includes a control circuit 611 and a logic circuit 612, for example, a register transfer level (RTL) logic circuit. The logic circuit 612 includes a trigger 6121, a first decoding circuit 6122 and a second decoding circuit 6123, which are coupled in sequence. It should be understood that, in some examples, other peripheral circuits not shown in FIG. 7 may also be included, which is not limited in examples of the present disclosure.

The control circuit 611 is configured to receive control commands, generate indication information according to the control commands, and send the indication information to the trigger 6121. The trigger 6121 is configured to receive the indication information, and send the indication information to the first decoding circuit 6122. The first decoding circuit 6122 is configured to determine a first encoded value of the die 600 according to the indication information, and the first encoded value may also be referred to as multi-die stack (MDS) value. The second decoding circuit 6123 is configured to decode the first encoded value to obtain the address of the die 600.

Optionally, the first encoded value of the die 600 determined by the first decoding circuit 6122 according to the indication information may include a 4-bit encoded value, an 8-bit encoded value, or an encoded value that may be in other modes, which is not limited in examples of the present disclosure.

For example, it is taken as an example that the die 600 is applied to the flash memory chip 420, the flash memory chip 420 includes 8 dies, and the first encoded value includes a 4-bit encoded value. As shown in Table 1 below, when the indication information is used for indicating that 1 die shares the same enable pin, the correspondence between the dies in the flash memory chip 420 and the enable pins may be referred to as one-to-one, and the first decoding circuit 6122 may determine that the first encoded value of the die 600 is 4'b1111 according to the indication information.

As another example, as shown in Table 1 below, when the indication information is used for indicating that 2 dies share the same enable pin, the correspondence between the dies in the flash memory chip 420 and the enable pins may be referred to as one-to-two, and the first decoding circuit 6122 may determine that the first encoded value of the die 600 is any of 4'b1101 or 4'b1100 according to the indication information.

As another example, as shown in Table 1 below, when the indication information is used for indicating that 4 dies share the same enable pin, the correspondence between the dies in the flash memory chip 420 and the enable pins may be referred to as one-to-four, and the first decoding circuit 6122 may determine that the first encoded value of the die 600 is any of 4'b1011, 4'b1010, 4'b1001 or 4'b1000 according to the indication information.

As another example, as shown in Table 1 below, when the indication information is used for indicating that 8 dies share the same enable pin, the correspondence between the dies in the flash memory chip 420 and the enable pins may be referred to as one-to-eight, and the first decoding circuit 6122 may determine that the first encoded value of the die 600 is any of 4'b0111, 4b0110, 4'b0101, 4'b0100, 4'b0011, 4'b0010, 4b0001 or 4'b1000 according to the indication information.

TABLE 1

| | Serial number of die | | | | | | | |
|---|---|---|---|---|---|---|---|---|
| | 0 | 1 | 2 | 3 | 4 | 5 | 6 | 7 |
| One-to-one | 4'b1111 | 4'b1111 | 4'b1111 | 4'b1111 | 4'b1111 | 4'b1111 | 4'b1111 | 4'b1111 |
| One-to-two | 4'b1101 | 4'b1100 | 4'b1101 | 4'b1100 | 4'b1101 | 4'b1100 | 4'b1101 | 4'b1100 |
| One-to-four | 4'b1011 | 4'b1010 | 4'b1001 | 4'b1000 | 4'b1011 | 4'b1010 | 4'b1001 | 4'b1000 |
| One-to-eight | 4'b0111 | 4'b0110 | 4'b0101 | 4'b0100 | 4'b0011 | 4'b0010 | 4'b0001 | 4'b0000 |

Optionally, when the second decoding circuit 6123 decodes the first encoded value to determine the address of the die 600, the address of the die 600 may include a 1-bit encoded value, a 4-bit encoded value, or an encoded value that may be in other modes, which is not limited in examples of the present disclosure.

For example, taking it as an example that the address of the die 600 includes the 1-bit encoded value, when the first encoded value is 4'b1111, the second decoding circuit 6123 may decode the first encoded value 4'b1111 to determine that the address of the die 600 is lun1.

According to the die 600 provided in examples of the present disclosure, the indication information is received and generated by the control circuit 611, the first encoded value of the die 600 is determined by the first decoding circuit 6122 according to the indication information, and then the second decoding circuit 6123 decodes the first encoded value to determine the address of the die 600, so that the configuration between the M dies and one enable pin can be implemented logically. In this way, when the flash memory chip 420 applies the die 600, the number of enable pins of the flash memory chip 420 can be flexibly configured according to the requirements of application programs for the capacity of the NAND storage device 400 and the number of enable pins of the main control chip 410, so that the package modes of the flash memory chip 420, which need to be verified and tested, can be reduced during production, thereby reducing production cost, and improving production efficiency. For example, since the package modes of flash memory chip is few, it is conducive to reducing import authentication tests of customers, thereby reducing material management and control costs, and meanwhile, it is also conducive to reducing test costs of customers and improving production efficiency. In addition, during the use of customers, by configuring the number of enable pins of the flash memory chip 420, different production requirements can be met, and the satisfaction of customers can be improved.

In one possible example, as shown in FIG. 7, the peripheral circuit 610 further includes a register 6124 coupled with the first decoding circuit 6122.

The first decoding circuit 6122 is further configured to set a first numerical value in the register 6124 to be a second numerical value. The first numerical value is used for indicating that the encoded value of the die 600 is a second encoded value, and the second numerical value is used for indicating that the encoded value of the die 600 is the first encoded value.

The first encoded value is the encoded value of the die 600 determined by the first decoding circuit 6122 according to the indication information, and the second encoded value is a preset encoded value of the die 600.

Optionally, the first numerical value may be 0, and the second numerical value may be 1; or, the first numerical value may be 1, and the second numerical value may be 0. The specific values of the first numerical value and the second numerical value are not limited in examples of the present disclosure.

For example, take it as an example that the die 600 is applied to the flash memory chip 420, the indication information is used for indicating that 2 dies share the same enable pin, and the two dies include a first die and a second die. When the first decoding circuit 6122 in the first die determines that the first encoded value of the first die is 4b'1000 according to the indication information, the first decoding circuit 6122 may set the first numerical value of 0 in the register 6124 to be a second numerical value of 1. Therefore, the control circuit 611 in the second die may determine, according to the numerical value in the register 6124 in the first die being the second numerical value of 1, that the first decoding circuit 6122 in the first die has determined the first encoded value, and has determined that the first encoded value is 4b'1000, Further, the control circuit 611 in the second die may control the first decoding circuit 6122 to determine that the first encoded value of the second die is 4b'1001. It can be understood that, by setting the register 6124 to be a different numerical value to indicate whether the first die has completed encoding, repeated encoding of the first die and the second die can be avoided, so as to avoid decoding the first encoded values of the first die and the second die to be the same address.

According to the die 600 provided in examples of the present disclosure, the register 6124 is set to be different numerical values by the first decoding circuit 6122, so that when the die 600 is applied to the flash memory chip 420, repeated encoding of the addresses of a plurality of dies in the flash memory chip 420 can be avoided.

Figure 8:
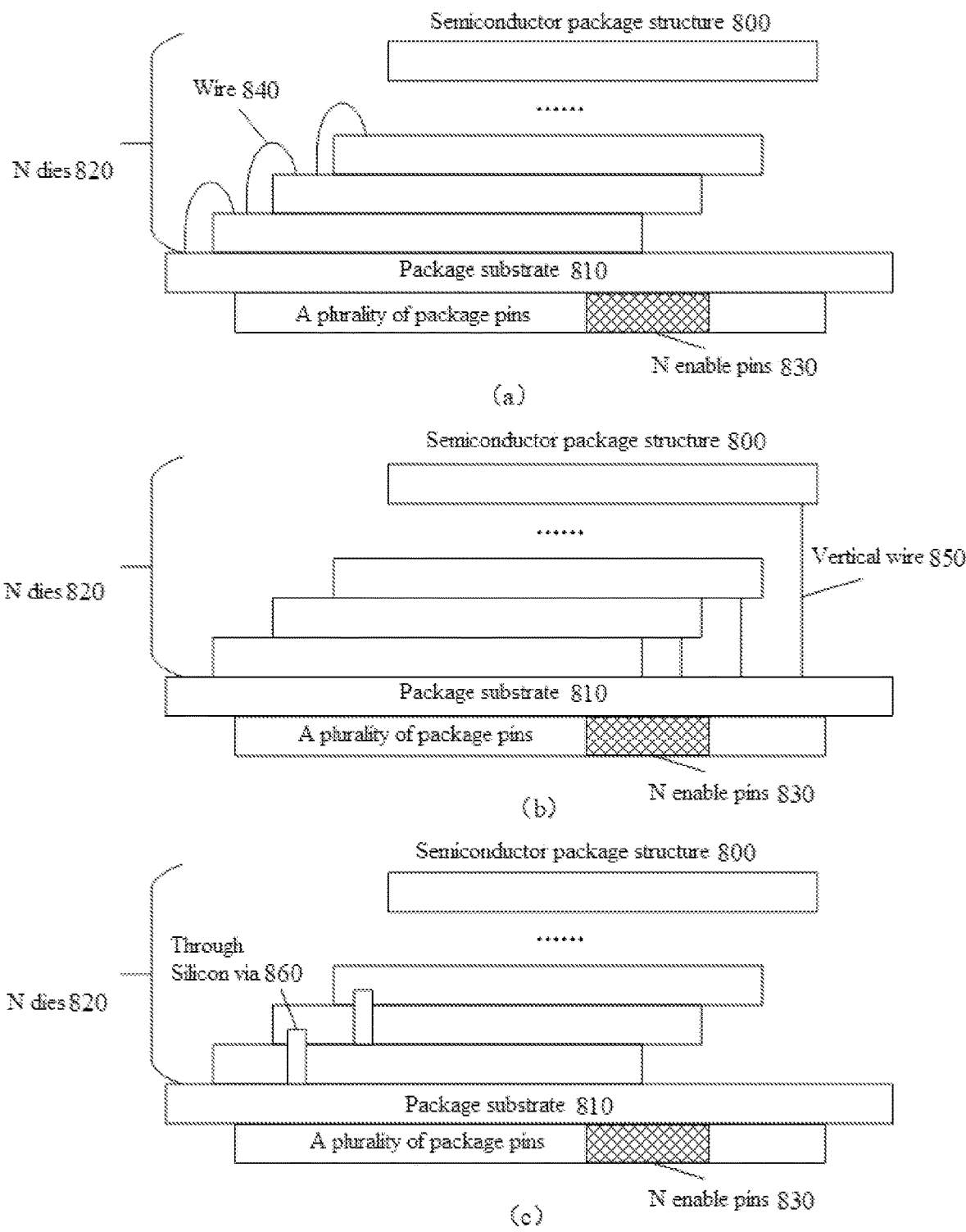
FIG. 8 is a schematic diagram of a semiconductor package structure according to some examples.

As shown in (a) in FIG. 8, examples of the present disclosure further provide a semiconductor package structure 800. The semiconductor package structure 800 includes a package substrate 810, N dies 820 disposed on the package substrate 810, and a plurality of package pins disposed on the package substrate 810. The plurality of package pins include N enable pins 830, the N dies 820 are coupled with one of the N enable pins 830 respectively, and the structure of the N dies 820 is the structure of the die shown in FIG. 6 or FIG. 7.

M dies among the N dies 820 are used for receiving control commands sent by the main control chip 410. The control commands are used for indicating the M dies to determine respective addresses. The address of each die is used for addressing an enable signal provided by the enable pin. M is a positive integer greater than or equal to 1. N is a positive integer greater than or equal to 2, and M is less than or equal to N.

Optionally, values of N may include any of 2, 4 or 8, and the specific value of N is not limited in examples of the present disclosure.

For example, when the value of N is 2, the semiconductor package structure 800 is a double die package (DDP) on which 2 dies are stacked. When the value of N is 4, the semiconductor package structure 800 is a quaternary die package (QDP) on which 4 dies are stacked. When the value of N is 8, the semiconductor package structure 800 is an octal die package on which 8 dies are stacked.

Optionally, values of M may include numerical values of 1, 2, 4, 8, 16 or 32 and the like. The specific value of M is not limited in examples of the present disclosure.

Optionally, the greater the number of enable pins on the main control chip 410, the smaller the value of M. The smaller the number of enable pins on the main control chip 410, the greater the value of M.

For example, it is taken as an example that the N dies 820 include 8 dies, and the N enable pins 830 include 8 enable pins of CE0 to CE8. When the number of enable pins on the main control chip 410 is 8, the value of M may be 1, as shown in (a) in FIG. 9, and each die is coupled with one enable pin. When the number of enable pins on the main control chip 410 is 4, the value of M may be 2, as shown in (b) in FIG. 9, and at this time, the enable pins corresponding to every 2 dies among the 8 dies may be connected together in a short-circuit mode by wiring in the printed circuit board, so that every 2 dies may share one enable pin on the main control chip 410. When the number of enable pins on the main control chip 410 is 2, the value of M may be 4, as shown in (c) in FIG. 9, and at this time, the enable pins corresponding to every 4 dies among the 8 dies may be connected together in the short-circuit mode by wiring in the printed circuit board, so that every 4 dies may share one enable pin on the main control chip. It can be understood that, according to the number of enable pins on the main control chip 410, the correspondence between the N dies 820 and the enable pins on the main control chip 410 can be flexibly configured by wiring in the printed circuit board.

As another example, taking it as an example that the N dies 820 include 2 dies and the value of M is 1, it can be understood that, at this time, the 2 dies are coupled with 1 enable pin on the main control chip 410 respectively, the 2 dies may receive the control commands sent by the main control chip 410 respectively. The control commands are used for indicating 1 die to determine respective address, so that the 2 dies can determine respective addresses according to the control commands.

Optionally, when M is greater than or equal to 2, encoded values of the M dies are different from each other, so that the dies sharing the same enable pin can be distinguished by different encoded values. Specifically, the encoded values of the M dies being different from each other includes: the first encoded values of the M dies are different from each other, and further, the second decoding circuit 6123 in each die may decode the first encoded values to obtain corresponding addresses, or, the encoded values of the addresses of the M dies are different from each other.

For example, in conjunction with Table 1, taking it as an example that the N dies 820 includes 8 dies, when the value of M is 2, every 2 dies among the 8 dies may receive control commands sent by the main control chip 410, determine respective first encoded values according to the control commands respectively, and the first encoded values of every 2 dies may be 4'b1101 and 4'b1100, respectively. Further, the second decoding circuit 6123 in each die may decode the respective corresponding first encoded value to obtain the respective corresponding address. When the value of M is 4, every 4 dies among the 8 dies may receive control commands sent by the main control chip 410, determine respective first encoded values according to the control commands respectively, and the first encoded values of every 4 dies may be 4'b1011, 4'b1010, 4'b1001 and 4'b1000, respectively. Further, the second decoding circuit 6123 in each die may decode the respective corresponding first encoded value to obtain the respective corresponding address.

Figure 9:
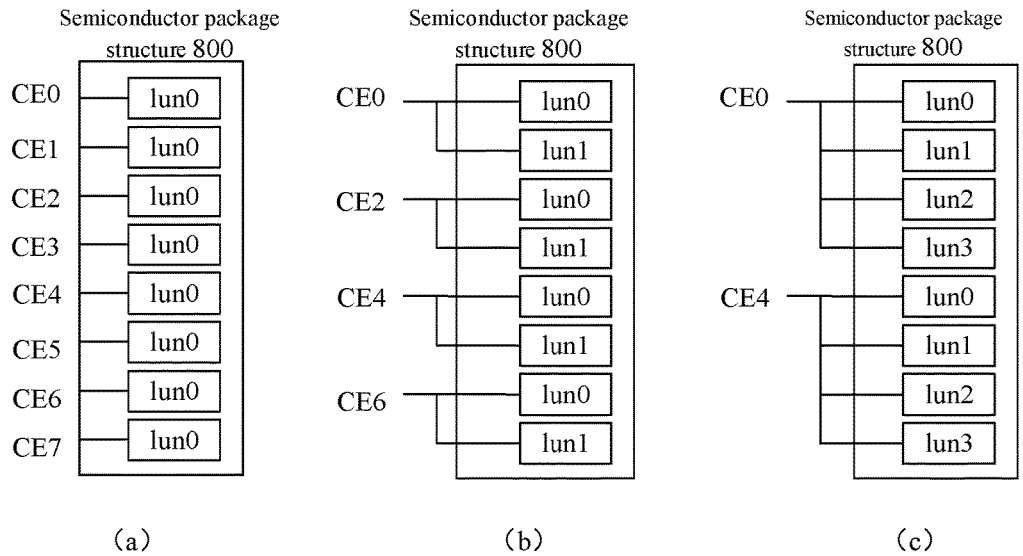
FIG. 9 is a schematic diagram of another semiconductor package structure according to some examples.

As another example, taking it as an example that the N dies 820 including 8 dies, in conjunction with (b) in FIG. 9, when the value of M is 2, every 2 dies among the 8 dies may receive control commands sent by the main control chip 410, and determine respective addresses according to the control commands, and the addresses of every 2 dies may be lun0 and lun1 respectively. In conjunction with (c) in FIG. 9, when the value of M is 4, every 4 dies among the 8 dies may receive the control commands sent by the main control chip 410, and determine respective addresses according to the control commands respectively, and the addresses of every 4 dies may be lun0, lun1, lun2 and lun3 respectively.

The M dies are further used for sending respective addresses to the main control chip 410. Optionally, when the semiconductor package structure 800 is applied to the flash memory chip 420, the M dies sending respective addresses includes: the M dies send respective addresses to the main control chip 410, so that the main control chip 410 can enable the corresponding dies by means of the enable pin shared by the M dies and the addresses of the M dies.

Figure 10:
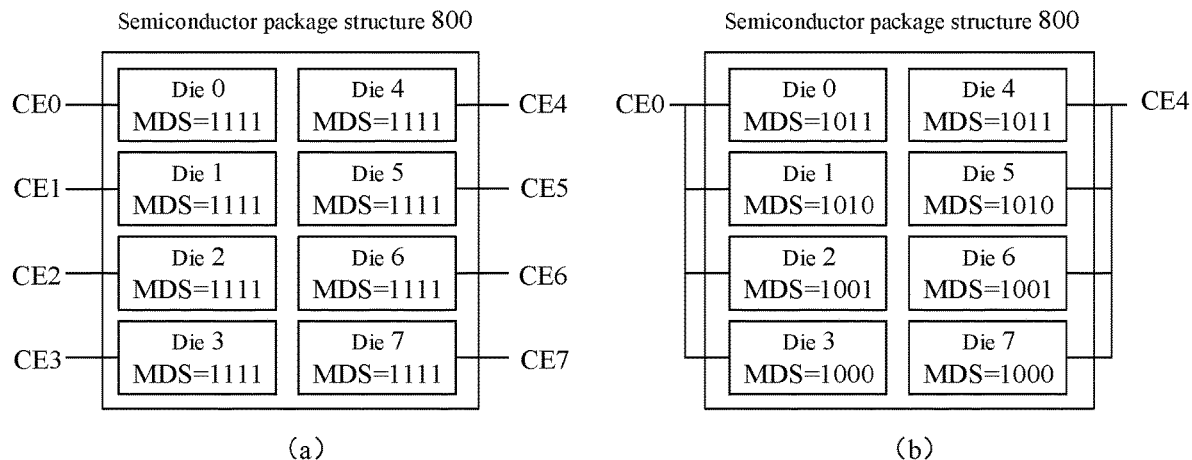
FIG. 10 is a schematic diagram of yet another semiconductor package structure according to some examples.

For example, as shown in (a) in FIG. 10, take it as an example that, in the semiconductor package structure 800, the N dies 820 include die 0 to die 7, the N enable pins 830 include CE0 to CE7, the initial MDSes of the 8 dies are all 4b'1111, and the 8 dies are coupled with one enable pin of the semiconductor package structure 800 respectively. As shown in (b) in FIG. 10, when the value of M is 4, the enable pins of every 4 dies among the 8 dies may be connected together in the short-circuit mode by wiring in the printed circuit board, so that a configuration in which 4 dies share one enable pin can be implemented physically. The main control chip 410 may send the control commands to die 0 to die 3 and die 4 to die 7 by means of the shared enable pin. Die 0 to die 3 and die 4 to die 7 may receive the control commands, and determine, according to the control commands, that the MDSes (first decoded values) of the 4 dies are 4b'1011, 4b'1010, 4b'1001 and 4b'1000, respectively. Furthermore, the second decoding circuit 6123 in each die among the 4 dies may determine the address corresponding to each die according to the corresponding DMS, and send the address corresponding to each die to the main control chip 410, so that a configuration in which the 4 dies share one enable pin can be implemented logically. In this way, the main control chip 410 may enable any of die 0 to die 3 by means of CE0 and the addresses of die 0 to die 3, and may enable any of die 4 to die 7 by means of CE4 and the addresses of die 4 to die 7.

It can be understood that, when the semiconductor package structure 800 provided in examples of the present disclosure is applied to the flash memory chip 420, the control commands are received by the M dies among the N dies 820, which share the same enable pin, respective addresses are determined according to the control commands, and the respective addresses are sent to the main control chip 410, so that the main control chip 410 may enable the corresponding die by means of the address of any of the M dies.

Optionally, the N dies 820 is coupled with the package substrate 810 in the following modes: coupled with the package substrate 810 in a wire bond mode, coupled with the package substrate 810 in a vertical wire bond mode, coupled with the package substrate 810 by means of through silicon via (TSV) technology, or may be coupled with the package substrate 810 in other modes. In examples of the present disclosure, how the N dies 820 are coupled with the package substrate 810 is not limited.

Optionally, when the N dies 820 are coupled with the package substrate 810, the N dies 820 may be coupled with the package substrate 810 in the same coupling mode, or may be coupled with the package substrate 810 in a variety of coupling modes, which may also be referred to as hybrid bond mode. The number of coupling modes used for coupling the N dies 820 with the package substrate 810 is not limited in examples of the present disclosure. [00%] The wire bond includes coupling any two of the N dies 820 or coupling the dies with the package substrate 810 by means of fine metal wires. The silicon via technology refers to penetrating through the N dies 820, so as to realize the coupling among the N dies 820 and the coupling between the N dies 820 and the package substrate 810.

For example, as shown in (a) in FIG. 8, any two of the N dies 820 may be bonded by wire 840, so that the N dies 820 are coupled with the package substrate 810. Or, as shown in (b) in FIG. 8, the N dies 820 may be coupled with the package substrate 810 by means of vertical wires 850, respectively. Or, as shown in (c) in FIG. 8, any two of the N dies 820 may be coupled by means of through silicon via 860, so as to couple the N dies 820 with the package substrate 810.

Optionally, the semiconductor package structure 800 may be packaged by using BGA package technology, or may be packaged by using thin small outline package (TSOP) technology. The package technology specifically adopted by the semiconductor package structure 800 is not limited in examples of the present disclosure.

Optionally, the specific value of M is in negative correlation with the number of a plurality of package pins on the semiconductor package structure 800. Specifically, the greater the number of the plurality of package pins, the small the specific value of M, and the smaller the number of the plurality of package pins, the greater the specific value of M.

For example, when the semiconductor package structure 800 is BGA132/BGA154ODP package, values of M may include 1, 2 or 4, and at this time, the number of enable pins of the semiconductor package structure 800 for receiving enable signals includes 8, 4 or 2. When the semiconductor package structure 800 is BGA272ODP package, compared with the semiconductor package structure 800 being the BGA132/BGA154ODP package, the semiconductor package structure 800 includes more package pins, and at this time, values of M may include 1 or 2, and the number of enable pins of the semiconductor package structure 800 for receiving enable signals includes 8 and 4.

Based on this, as shown by example in the following Table 2 and Table 3, the examples of the present disclosure further provide package modes that the semiconductor package structure 800 may support, and possible values of the number of enable pins for receiving enable signals in the various package modes.

TABLE 2

| BGA132/154 | DDP/2CE | QDP/4CE | ODP/8CE | HDP/16CE |
|---|---|---|---|---|
| The number of enable pins | 2 | 4 | 8 | 16 |
|  |  | 2 | 4 | 8 |
|  |  |  | 2 | 4 |
|  |  |  |  | 2 |

TABLE 3

| BGA272 | QDP/4CE | ODP/8CE | HDP/16CE |
|---|---|---|---|
| The number of enable pins | 4 | 8 | 16 |
|  |  | 4 | 8 |
|  |  |  | 4 |

It should be noted that, related descriptions about the die 600 in the above examples may be cited correspondingly in the examples of the semiconductor package structure 800, and thus details are not described any more herein.

In the semiconductor package structure 800 provided in the examples of the present disclosure, the control commands are received by M dies sharing the same enable pin, the respective addresses are determined according to the control commands, and then the respective addresses are sent, so that the configuration in which the M dies share one enable pin can be implemented logically. In this way, when the semiconductor package structure 800 is applied to the flash memory chip 420, the number of enable pins of the flash memory chip 420 can be flexibly configured according to the requirements of application programs for the capacity of the NAND storage device 400 and the number of enable pins of the main control chip 410, so that package modes of the flash memory chip 420 can be reduced during production, thereby reducing occupied package reliability authentication resources and test program development resources, reducing production cost, and improving production efficiency. For example, since the flash memory chip has few package modes, it is conducive to reducing import authentication tests of customers, thereby reducing material management and control costs, and meanwhile, it is also conducive to reducing the test costs of customers and improving production efficiency. In addition, during the use of customers, by configuring the number of enable pins of the flash memory chip 420, different production requirements can be met, and the satisfaction of customers can be improved.

In one possible example, the M dies include a target die therein. The target die is used for receiving chip selection signals, the chip selection signals are used for selecting the target die to receive the enable signal, and the chip selection signals include the address of the target die.

Optionally, the target die may be any of the M dies, and it is not limited in examples of the present disclosure that which of the M dies is the target die.

Optionally, when the semiconductor package structure 800 is applied to the flash memory chip 420, the target die receiving chip selection signals includes: receiving the chip selection signals sent by the main control chip 410.

For example, in conjunction with (b) in FIG. 10, it is taken as an example that the value of M is 4, the 4 dies include target die 0, and the address of die 0 is lun0. The target die 0 may receive the chip selection signals sent by the main control chip 410, and the chip selection signals may include the address lun0 of die 0, thus the chip selection signals may select the die 0, so that the die 0 may receive the enable signals sent by the main control chip 410 by means of the enable pin CE0.

According to the semiconductor package structure 800 provided in the examples of the present disclosure, the target die among the M dies receives the chip selection signals including the address of the target die, so that the target die can be selected by the chip selection signals, and the target die can receive the enable signals.

As shown in FIG. 11, the examples of the present disclosure further provide an enable pin configuration method of a die, which may be applied in the die 600, and the method includes S1101 to S1102.

S1101: the peripheral circuit 610 receives control commands, and generates indication information according to the control commands, wherein the control commands are used for indicating the die 600 to determine the address of the die 600, the indication information is used for indicating M dies to share the same enable pin, and M is a positive integer greater than or equal to 1.

Optionally, the die 600 may be any of the M dies, which is not limited in examples of the present disclosure.

Optionally, values of M include 1, 2, 4, 8, 16 or 32, and the specific value of M is not limited in examples of the present disclosure.

In one possible example, the peripheral circuit 610 includes a control circuit 611. The peripheral circuit 610 receiving the control commands and generating indication information according to the control commands includes: receiving, by the control circuit 611, the control commands, generating the indication information according to the control commands, and sending the indication information.

S1102: the peripheral circuit 610 determines the address of the die 600 according to the indication information, and sends the address of the die 600. The address is used for addressing enable signals provided by enable pins.

Optionally, the address encoded value of the die 600 may include 1 bit, or may include more than one bit, and how many bits are used for encoding the specific address encoded value of the die 600 is not limited in examples of the present application.

In one possible example, the peripheral circuit 610 further includes a logic circuit 612, the logic circuit 612 includes a trigger 6121, a first decoding circuit 6122 and a second decoding circuit 6123, which are coupled in sequence. Determining the address of the die 600 according to the indication information includes: receiving, by the trigger 6121, the indication information, and sending the indication information to the first decoding circuit 6122; determining, by the first decoding circuit 6122, a first encoded value of the die 600 according to the indication information; and decoding, by the second decoding circuit 6123, the first encoded value to obtain the address of the die 600.

Optionally, the first encoded value of the die 600 determined by the first decoding circuit 6122 according to the indication information includes a 4-bit encoded value, an 8-bit encoded value, or an encoded value that may be in other modes, which is not limited in examples of the present disclosure.

Optionally, when the second decoding circuit 6123 decodes the first encoded value to determine the address of the die 600, the address of the die 600 may include a 1-bit encoded value, a 4-bit encoded value, or an encoded value that may be in other modes, which is not limited in examples of the present disclosure.

According to the enable pin configuration method of the die provided in examples of the present disclosure, the peripheral circuit 610 receives the control commands, generates indication information, and determines the address of the die 600 according to the indication information, so that the configuration in which the M dies share one enable pin can be implemented logically. In this way, when the die 600 is applied to the flash memory chip 420, the number of enable pins of the flash memory chip 420 can be flexibly configured according to the requirements of application programs for the capacity of NAND storage device 400 and the number of enable pins of the main control chip 410, so that package modes of flash memory chip 420 can be reduced during production, thereby reducing occupied package reliability authentication resources and test program development resources, reducing production cost, and improving production efficiency.

In one possible example, the peripheral circuit 610 further includes a register 6124 coupled with the first decoding circuit 6122, and as shown in FIG. 12, after S1102, the method may further include S1103.

S1103: the first decoding circuit 6122 sets a first numerical value in the register 6124 to be a second numerical value. The first numerical value is used for indicating that the encoded value of the die 600 is a second encoded value, and the second numerical value is used for indicating that the encoded value of the die 600 is the first encoded value.

The first encoded value is the encoded value of the die 600 determined by the first decoding circuit 6122 according to the indication information, and the second encoded value is the encoded value of the die 600 before the first decoding circuit 6122 determines the first encoded value of the die 600 according to the indication information.

Optionally, the first numerical value may be 0, and the second numerical value may be 1; or, the first numerical value may be 1, the second numerical value may be 0. The specific values of the first numerical value and the second numerical value are not limited in examples of the present disclosure.

It should be noted that, the related descriptions about the die 600 in the above examples may be cited correspondingly in the examples of the enable pin configuration method of the die, and thus details are not described any more herein.

According to the enable pin configuration method of die provided in examples of the present disclosure, the register 6124 is set to be different numerical values by the first decoding circuit 6122, so that when the die 600 is applied to the flash memory chip 420, repeated encoding of the addresses of a plurality of dies in the flash memory chip 420 can be avoided.

As shown in FIG. 13, the examples of the present disclosure further provide an enable pin configuration method of a semiconductor package structure, which may be applied in the semiconductor package structure 800 including the N dies 820. Any of the N dies 820 includes the peripheral circuit 610, and the method includes S1301 to S1302.

S1301: the peripheral circuit 610 receives the control commands, and generates indication information according to the control commands, wherein the control commands are used for indicating the die 600 to determine the address of the die 600, the indication information is used for indicating M dies to share the same enable pin, and M is a positive integer greater than or equal to 1.

Optionally, values of N may include any of 2, 4 or 8, and the specific value of N is not limited in examples of the present disclosure.

Optionally, values of M may include 1, 2, 4, 8, 16 or 32, and the specific value of M is not limited in examples of the present disclosure.

Optionally, when M is greater than or equal to 2, the encoded values of the M dies are different from each other, so that the dies sharing the same enable pin can be distinguished by different encoded values.

In one possible example, the peripheral circuit 610 includes a control circuit 611. The peripheral circuit 610 receiving the control commands and generating indication information according to the control commands includes: receiving, by the control circuit 611, the control commands, generating the indication information according to the control commands, and sending the indication information.

S1302: the peripheral circuit 610 determines the address of the die 600 according to the indication information, and sends the address of the die 600. The address is used for addressing enable signals provided by enable pins.

Optionally, the address encoded value of the die 600 may include 1 bit, or may include more than one bit, and how many bits are used for encoding the specific address encoded value of the die 600 is not limited in examples of the present application.

In one possible example, the peripheral circuit 610 further includes a trigger 6121, a first decoding circuit 6122 and a second decoding circuit 6123, which are coupled in sequence. Determining the address of the die 600 according to the indication information includes: receiving, by the trigger 6121, the indication information, and sending the indication information to the first decoding circuit 6122, determining, by the first decoding circuit 6122, a first encoded value of the die 600 according to the indication information; and decoding, by the second decoding circuit 6123, the first encoded value to obtain the address of the die 600.

Optionally, the first encoded value of the die 600 determined by the first decoding circuit 6122 according to the indication information includes a 4-bit encoded value, an 8-bit encoded value, or an encoded value that may be in other modes, which is not limited in examples of the present disclosure.

Optionally, when the second decoding circuit 6123 decodes the first encoded value to determine the address of the die 600, the address of the die 600 may include a 1-bit encoded value, a 4-bit encoded value, or an encoded value in other modes, which is not limited in examples of the present disclosure.

According to the enable pin configuration method of the semiconductor package structure provided in examples of the present disclosure, the peripheral circuit 610 receives the control commands, generates indication information, determines the address of the die 600 according to the indication information, and sends the address of the die 600, so that the configuration in which the M dies share one enable pin can be implemented logically. In this way, when the die 600 is applied to the flash memory chip 420, the number of enable pins of the flash memory chip 420 can be flexibly configured according to the requirements of application programs for the capacity of NAND storage device 400 and the number of enable pins of the main control chip 410, so that package modes of the flash memory chip 420 can be reduced during production, thereby reducing occupied package reliability authentication resources and test program development resources, reducing production cost, and improving production efficiency.

In one possible example, the peripheral circuit 610 further includes a register 6124 coupled with the first decoding circuit 6122. As shown in FIG. 13, after S1302, the method may further include S1303.

S1303: the first decoding circuit 6122 sets a first numerical value in the register 6124 to be a second numerical value. The first numerical value is used for indicating that the encoded value of the die 600 is a second encoded value, and the second numerical value is used for indicating that the encoded value of the die 600 is the first encoded value.

The first encoded value is the encoded value of the die 600 determined by the first decoding circuit 6122 according to the indication information, and the second encoded value is the encoded value of the die 600 before the first decoding circuit 6122 determines the first encoded value of the die 600 according to the indication information.

Optionally, the first numerical value may be 0, and the second numerical value may be 1; or, the first numerical value may be 1, the second numerical value may be 0. The specific values of the first numerical value and the second numerical value are not limited in examples of the present disclosure.

According to the enable pin configuration method of the semiconductor package structure provided in examples of the present disclosure, the register 6124 is set to be different numerical values by the first decoding circuit 6122, so that when the die 600 is applied to the flash memory chip 420, repeated encoding of the addresses of a plurality of dies in the flash memory chip 420 can be avoided.

In one possible example, the M dies in the semiconductor package structure 800 include a target die therein. Further, as shown in FIG. 13, after S1303, the method further includes S1304.

S1304: the peripheral circuit 610 in the target die receives chip selection signals, the chip selection signals are used for selecting the target die to receive enable signals, and the chip selection signals include the address of the target die.

Optionally, the target die may be any of the M dies, and it is not limited in examples of the present disclosure that which one of the M dies is the target die.

It should be noted that, the related descriptions about the semiconductor package structure 800 in the above examples may be cited correspondingly in the examples of the enable pin configuration method of the semiconductor package structure, and thus details are not described any more herein.

According to the enable pin configuration method of the semiconductor package structure provided by examples of the present disclosure, the target die in the M dies receives the chip selection signals including the address of the target die, so that the target die can be selected by the chip selection signals, and the target die can receive enable signals.

Examples of the present disclosure further provide a memory, including the semiconductor package structure 800 as shown in FIG. 5 to FIG. 7. For example, the memory may be NAND memory 122 shown in FIG. 1 or FIG. 2 in the foregoing examples.

Examples of the present disclosure further provide a storage system, including a controller and at least one memory coupled with the controller. The controller is used for controlling the memory to read data, and the memory has the structure of the memory as shown in FIG. 11. For example, the storage system may be the storage system 120 shown in FIG. 1 or FIG. 2 in the foregoing examples.

As another example, the storage system may be the NAND storage device 400 as shown in FIG. 4, the controller may be the main control chip 410, and the at least one memory may be the flash memory chip 420.

The examples of the present disclosure further provide an electronic device, including a storage system and a processor coupled with the storage system. For example, the electronic device may be the electronic device shown in FIG. 1 in the foregoing examples.

It should be noted that, the related descriptions about the die 600 and the semiconductor package structure 800 in the above examples may be cited correspondingly in the examples of the memory, the storage system and the electronic device, and thus details are not described any more herein.

Examples of the present disclosure provide a die, a semiconductor package structure, an enable pin configuration method, and a memory, so as to solve the problems in the prior art that a flash memory chip includes a fixed number of chip enable pins, which result in high production cost and low production efficiency.

In order to achieve the above objective, examples of the present disclosure use the following technical solutions:

In one aspect, provided is a die including a peripheral circuit, and the peripheral circuit is configured to: receive control commands, generate indication information according to the control commands, determine the address of the die according to the indication information, and send the address of the die, wherein the control commands are used for indicating the die to determine the address of the die; the indication information is used for indicating M dies to share the same enable pin, and M is a positive integer greater than or equal to 1; and the address is used for addressing an enable signal provided by the enable pin.

According to the die provided in examples of the present disclosure, the peripheral circuit receives the control commands, generates the indication information, and determines the address of the die according to the indication information, so that a configuration in which the M dies share one enable pin can be implemented logically. In this way, when the die is applied to a flash memory chip, the number of enable pins of the flash memory chip can be flexibly configured according to the requirements of an application program for the capacity of a NAND storage device and the number of enable pins of a main control chip, so that package modes of the flash memory chip can be reduced during production, thereby reducing occupied package reliability authentication resources and test program development resources, reducing production cost, and improving production efficiency. For example, since package modes of the flash memory chip is few, the present disclosure helps customers to reduce import authentication tests, thereby reducing material management and control cost, and meanwhile, the present disclosure also helps customers to reduce test costs and improve production efficiency. In addition, during the use by customers, by configuring the number of enable pins of the flash memory chip, different production requirements can be met, and satisfaction of customers can be improved.

In some examples, the peripheral circuit includes: a control circuit, and a trigger, a first decoding circuit and a second decoding circuit, which are coupled in sequence, wherein the control circuit is configured to receive the control commands, generate the indication information according to the control commands, and send the indication information. The trigger is configured to receive the indication information and send the indication information to the first decoding circuit. The first decoding circuit is configured to determine a first encoded value of the die according to the indication information. The second decoding circuit is configured to decode the first encoded value to obtain the address of the die.

According to the die provided in examples of the present disclosure, the indication information is received and generated by the control circuit, the first encoded value of the die is determined by the first decoding circuit according to the indication information, and then the second decoding circuit decodes the first encoded value to determine the address of the die, so that the configuration between M dies and one enable pin can be implemented logically.

In some examples, the peripheral circuit further includes a register coupled with the first decoding circuit. The first decoding circuit is further configured to set a first numerical value in the register to be a second numerical value, the first numerical value is used for indicating that the encoded value of the die is a second encoded value, and the second numerical value is used for indicating that the encoded value of the die is the first encoded value.

According to the die provided in examples of the present disclosure, the register is set to be different numerical values by the first decoding circuit, so that when the die is applied to the flash memory chip, repeated encoding of the addresses of a plurality of dies in the flash memory chip can be avoided.

In some examples, values of M include 1, 2, 4, 8, 16 or 32.

In another aspect, provided is a semiconductor package structure including N dies as described above. M dies among the N dies are used for receiving control commands, the control commands are used for indicating the M dies to determine respective addresses, which are used for addressing enable signals provided by enable pins. M is a positive integer greater than or equal to 1. N is a positive integer greater than or equal to 2, and M is less than or equal to N. The M dies are further used for sending the respective addresses.

In some examples, when M is greater than or equal to 2, the encoded values of the M dies are different from each other.

In some examples, the M dies include a target die therein, wherein the target die is used for receiving chip selection signal, the chip selection signals are used for selecting the target die to receive the enable signal, and the chip selection signals include the address of the target die.

In yet another aspect, provided is an enable pin configuration method of a die, the die includes a peripheral circuit, and the method includes: receiving, by the peripheral circuit, control commands, generating indication information according to the control commands, determining the address of the die according to the indication information, and sending the address of the die, wherein the control commands are used for indicating the die to determine the address of the die, the indication information is used for indicating M dies to share the same enable pin, and M is a positive integer greater than or equal to 1; and the address is used for addressing an enable signal provided by the enable pin.

In some examples, the peripheral circuit includes: a control circuit, and a trigger, a first decoding circuit and a second decoding circuit, which are coupled in sequence, and the method further includes: receiving, by the control circuit, control commands, generating indication information according to the control commands, and sending the indication information; receiving, by the trigger, the indication information, and sending the indication information to the first decoding circuit: determining, by the first decoding circuit, a first encoded value of the die according to the indication information; and decoding, by the second decoding circuit, the first encoded value to obtain the address of the die.

In some examples, the peripheral circuit further includes a register coupled with the first coding circuit, and the method further includes: setting, by the first decoding circuit, a first numerical value in the register to be a second numerical value, the first numerical value being used for indicating that the encoded value of the die is a second encoded value, the second numerical value being used for indicating that the encoded value of the die is the first encoded value.

In some examples, values of M include 1, 2, 4, 8, 16 or 32.

In yet another aspect, provided is an enable pin configuration method of a semiconductor package structure including N dies, any of the N dies includes a peripheral circuit, N is a positive integer greater than or equal to 2, and the method includes: receiving, by the peripheral circuit, control commands, generating indication information according to the control commands, determining the address of the die according to the indication information, and sending the address of the die, wherein the control commands are used for indicating the die to determine the address of the die; the indication information is used for indicating M dies to share the same enable pin, and M is a positive integer greater than or equal to 1; and the address of the peripheral circuit is used for addressing an enable signal provided by the enable pin.

In some examples, the peripheral circuit includes: a control circuit, and a trigger, a first decoding circuit and a second decoding circuit, which are coupled in sequence, and the method further includes: receiving, by the control circuit, control commands, generating indication information according to the control commands, and sending the indication information; receiving, by the trigger, the indication information, and sending the indication information to the first decoding circuit; determining, by the first decoding circuit, a first encoded value of the die according to the indication information; and decoding, by the second decoding circuit, the first encoded value to obtain the address of the die.

In some examples, the peripheral circuit further includes a register coupled with the first decoding circuit, and the method further includes: setting, by the first decoding circuit, a first numerical value in the register to be a second numerical value, the first numerical value being used for indicating that the encoded value of the die is a second encoded value, the second numerical value being used for indicating that the encoded value of the die is the first encoded value.

In some examples, values of M include 1, 2, 4, 8, 16 or 32.

In some examples, when M is greater than or equal to 2, the encoded values of the M dies are different from each other.

In some examples, the M dies include a target die therein, and the method further includes: receiving, by the peripheral circuit in the target die, chip selection signals, the chip selection signals being used for selecting the target die to receive the enable signal, and the chip selection signals including the address of the target die.

In yet another aspect, provided is a memory, including the semiconductor package structure provided in the foregoing several aspects.

In yet another aspect, provided is a storage system, including a controller and at least one memory coupled with the controller, the controller being used for controlling the memory to read data, and the memory being the memory as described above.

In yet another aspect, provided is an electronic device, including the storage system provided above.

It can be understood that, with regard to the beneficial effects that may be achieved by the semiconductor package structure, the enable pin configuration method of the die, the enable pin configuration method of the semiconductor package structure, the memory, the storage system and the electronic device provided in above examples of the present disclosure, reference may be made to the beneficial effects of the die as mentioned above, and thus details are not described here.

The above descriptions are merely specific implementations of the present application, and the protection scope of the present disclosure is not limited thereto. Any changes or substitutions within the technical scope disclosed in the present disclosure shall fall into the protection scope of the present disclosure. Therefore, the protection scope of the present disclosure shall be subject to the claimed scope of the claims.

What is claimed is:

1. A die comprising a peripheral circuit, the peripheral circuit configured to:
   receive control commands, the control commands for indicating the die to determine an address of the die;
   generate indication information for M dies based on the control commands, the indication information to include address encoding information of the M dies, the indication information being used for indicating the M dies to share a same enable pin, M being a positive integer greater than or equal to 1;
   determine the address of a die of the M dies based on the indication information, wherein to determine the address further includes to decode the indication information to produce a first encoded value based on a number of dies sharing the same enable pin and to decode the first encoded value to obtain the address of the die; and
   send the address of the die to a main control chip, the main control chip to enable the die via an enable signal provided by the same enable pin to the address.

2. The die of claim 1, wherein the peripheral circuit includes:
   a control circuit, a trigger, a first decoding circuit, and a second decoding circuit, which are coupled in sequence;
   the control circuit is configured to receive the control commands, generate the indication information based on the control commands, and send the indication information;
   the trigger is configured to receive the indication information and send the indication information to the first decoding circuit;
   the first decoding circuit is configured to determine the first encoded value of the die based on the indication information; and
   the second decoding circuit is configured to decode the first encoded value to obtain the address of the die.

3. The die of claim 2, wherein the peripheral circuit further includes a register coupled with the first decoding circuit, and the first decoding circuit is further configured to set a first numerical value in the register to be a second numerical value, the first numerical value is used for indicating that an encoded value of the die is a second encoded value, and the second numerical value is used for indicating that the encoded value of the die is the first encoded value.

4. The die of claim 3, wherein values of M include 1, 2, 4, 8, 16 or 32.

5. A semiconductor package structure, wherein the semiconductor package structure comprises N dies configured to at least:
   receive control commands using M dies among the N dies, the control commands for indicating a die to determine an address of the die, and wherein M is a positive integer greater than or equal to 1, N is a positive integer greater than or equal to 2, and M is less than or equal to N;
   generate indication information for M dies based on the control commands, the indication information to include address encoding information of the M dies, the indication information being used for indicating the M dies to share a same enable pin;
   determine the address of the die of the M dies based on the indication information, wherein to determine the address further includes to decode the indication information to produce a first encoded value based on a number of dies sharing the same enable pin and to decode the first encoded value to obtain the address of the die; and
   send the address of the die to a main control chip via the M dies, the main control chip to enable the die via an enable signal provided by the same enable pin to the address.

6. The semiconductor package structure of claim 5, wherein when M is greater than or equal to 2, encoded values of the M dies are different from each other.

7. The semiconductor package structure of claim 6, wherein the M dies include a target die therein, wherein the target die is used for receiving chip selection signals, the chip selection signals are used for selecting the target die to receive the enable signal and include the address of the target die.

8. An enable pin configuration method of a die, wherein the die includes a peripheral circuit, and the method comprises:
   receiving, by the peripheral circuit, control commands, the control commands for indicating the die to determine an address of the die;
   generating indication information for M dies based on the control commands, the indication information including address encoding information of the M dies, the indication information being used for indicating the M dies to share a same enable pin, M being a positive integer greater than or equal to 1;
   determining, by the peripheral circuit, the address of the die based on the indication information, wherein determining the address further includes to decode the indication information to produce a first encoded value based on a number of dies sharing the same enable pin and to decode the first encoded value to obtain the address of the die; and
   sending the address of the die to a main control chip, the main control chip to enable the die via an enable signal provided by the same enable pin to the address.

9. The method of claim 8, wherein the peripheral circuit includes a control circuit, a trigger, a first decoding circuit, and a second decoding circuit, which are coupled in sequence, and the method further includes:

receiving, by the control circuit, the control commands, generating the indication information based on the control commands, and sending the indication information;

receiving, by the trigger, the indication information, and sending the indication information to the first decoding circuit;

determining, by the first decoding circuit, the first encoded value of the die based on the indication information; and decoding, by the second decoding circuit, the first encoded value to obtain the address of the die.

10. The method of claim 9, wherein the peripheral circuit further includes a register coupled with the first decoding circuit, and the method further includes setting, by the first decoding circuit, a first numerical value in the register to be a second numerical value, the first numerical value being used for indicating that an encoded value of the die is a second encoded value, the second numerical value being used for indicating that the encoded value of the die is the first encoded value.

11. The method of claim 10, wherein values of M include 1, 2, 4, 8, 16 or 32.

* * * * *